(12) United States Patent
La Rosa et al.

(10) Patent No.: US 7,023,041 B2
(45) Date of Patent: Apr. 4, 2006

(54) TRENCH CAPACITOR VERTICAL STRUCTURE

(75) Inventors: Giuseppe La Rosa, Fishkill, NY (US); Thomas W. Dyer, Pleasant Valley, NY (US); Oleg Gluschenkov, Wappingers Falls, NY (US); Jack A. Mandelman, Flat Rock, NC (US); Carl J. Radens, LaGrangeville, NY (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/341,187

(22) Filed: Jan. 13, 2003

(65) Prior Publication Data

US 2004/0135188 A1    Jul. 15, 2004

(51) Int. Cl.
*H01L 27/108* (2006.01)
*H01L 29/76* (2006.01)

(52) U.S. Cl. ...................... 257/302; 257/301
(58) Field of Classification Search ............... 257/71, 257/302
See application file for complete search history.

(56) References Cited

U.S. PATENT DOCUMENTS

| 4,970,689 | A | 11/1990 | Kenney |
| 5,001,526 | A | 3/1991 | Gotou |
| 5,177,576 | A * | 1/1993 | Kimura et al. ............... 257/71 |
| 5,293,053 | A | 3/1994 | Malhi et al. |
| 5,519,236 | A | 5/1996 | Ozaki |
| 5,770,875 | A | 6/1998 | Assaderaghi et al. |
| 6,037,210 | A | 3/2000 | Leas |
| 6,355,954 | B1 | 3/2002 | Gall et al. |
| 6,720,606 | B1 * | 4/2004 | Nitayama et al. ........... 257/306 |
| 2002/0070403 | A1 | 6/2002 | Hsu et al. |
| 2002/0088989 | A1 | 7/2002 | Kim |
| 2002/0094615 | A1 | 7/2002 | Kunikiyo |

* cited by examiner

*Primary Examiner*—Amir Zarabian
*Assistant Examiner*—Kiesha Rose
(74) *Attorney, Agent, or Firm*—Eric W. Petraske

(57) ABSTRACT

A versatile structure is formed, based on a deep trench, vertical transistor DRAM cell, that forms a conductive extension of the trench electrode in an elongated trench that contacts the lower electrode of the vertical transistor. The structure can be used as a capacitor, as a discrete transistor as a single-transistor amplifier or as a building block for more complex circuits.

17 Claims, 5 Drawing Sheets

TRENCH CAPACITOR VERTICAL STRUCTURE

TECHNICAL FIELD

The field of the invention is that of forming deep trenches in integrated circuit processing, in particular, forming transistors within the trenches.

BACKGROUND OF THE INVENTION

It is known in the art to form a DRAM cell having a vertical transistor located in the upper portion of a trench capacitor.

It is also known to turn the node of that structure into a decoupling capacitor by performing a heavy implant that shorts out the transistor source and drain junctions. The array transistor is used to transfer a voltage to the node. The decoupling capacitor is an effective circuit element within the trench.

SUMMARY OF THE INVENTION

The invention relates to a process for forming an elongated trench in which the dimension along the elongated dimension is large enough to hold at least two vertical members constructed according to the then-current process ground rules.

A feature of the invention is the formation of a larger capacitor in the elongated trench.

Another feature of the invention is the formation of a resistor having two contacts in the trench.

Another feature of the invention is the formation of both a vertical transistor and also other circuit elements within the trench.

A feature of the invention is making contact to the lower electrode of the vertical transistor through the other portion of the trench.

Another feature of the invention is the formation of a trench having a transistor and a resistor in series.

Another feature of the invention is the formation of a trench having a vertical transistor and a resistor as well a capacitor in series or parallel.

Another feature of the invention is the formation of a trench having two or more transistors in series.

Another feature of the invention is the formation of a trench having two or more transistors in parallel.

Another feature of the invention is the formation of an elongated trench having combinations of vertical PMOSFET and NMOSFET devices to make inverter or other logic circuits in the trench.

DETAILED DESCRIPTION

Figure 1C:
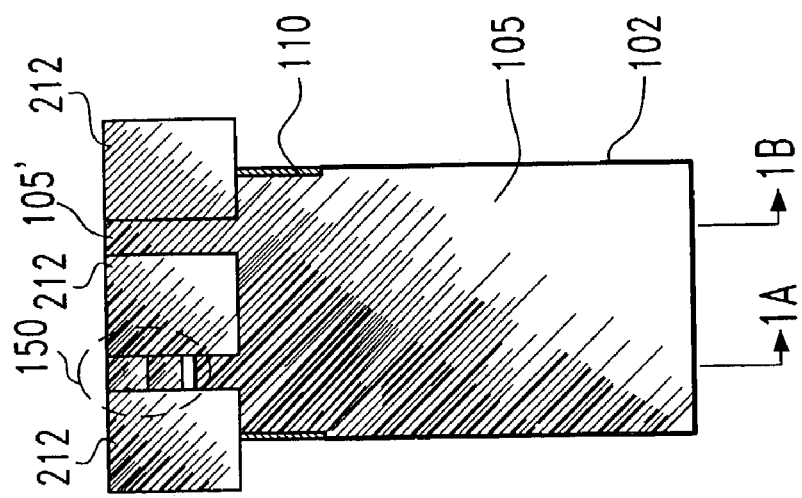
FIGS. 1A–1C illustrate a typical embodiment of the invention.

FIG. 1C shows in cross section a circuit module according to the invention. This module contains a conventional vertical NMOSFET 150 having a lower electrode that may be contacted through a polysilicon extension of the center electrode 105 of the trench. A large elongated trench at the bottom of the Figure has been formed with a dimension that supports two structures. The term "elongated" as used in the claims means that the dimension in question is lange enough to hold two members according to the then-current ground rules. The one on the left, (also shown in FIG. 1A) is a vertical transistor 150. The one on the right (also shown in FIG. 1B) is a contact extension 105' that makes contact between the surface of the substrate and the trench.

Figure 1B:
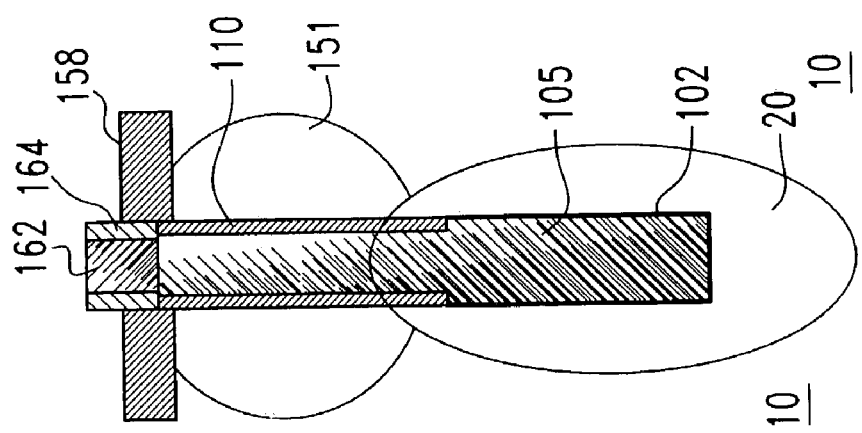
Figure 1A:
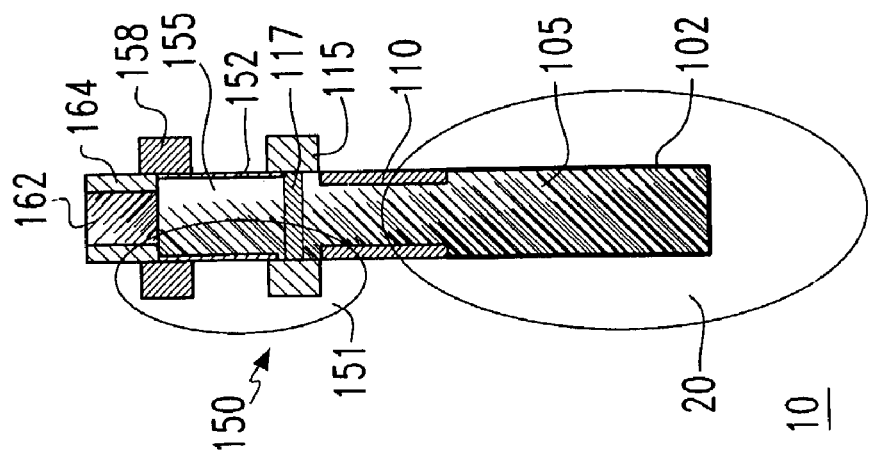

FIG. 1A shows the transistor 150 having a conventional buried strap 115 making contact to the trench electrode 105. Transistor 150 contains gate oxide 152 and gate 155, also having upper electrode 158 (also referred to as a surface contact) that, in this case makes contact with the bitline of a DRAM array. Below transistor 150, there is a conventional capacitor structure with buried plate 20 formed in substrate 10 and trench dielectric 102 and trench electrode 105.

FIG. 1B demonstrates that the capacitor elements are in common, but that the collar electrode 110 extends up through p-well 151 that is the vertical location where transistor 150 is located, with contact 162 making direct contact with capacitor electrode 105.

Although the structure shown in FIGS. 1A, 1B and 1C applies to a DRAM cell, its basic features can be used for other possible circuits such SRAM, EDRAM etc. As an illustration, it is not necessary that the depth of the trench be great enough to contain a DRAM capacitor when there is no DRAM array in the circuit (in the case of an SRAM array, for example).

As will be discussed below, this structure is formed by making the lower portion of the trench simultaneously through the steps of forming collar electrode 110 and filling the trench with electrode 105, then putting a blocking mask over the structure of FIG. 1B while the transistor is formed on the left of FIG. 1C.

Figure 2A:
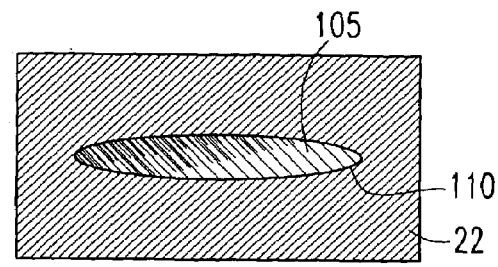
FIGS. 2A–2B illustrate a step in the formation of vertical transistors.
Figure 2B:
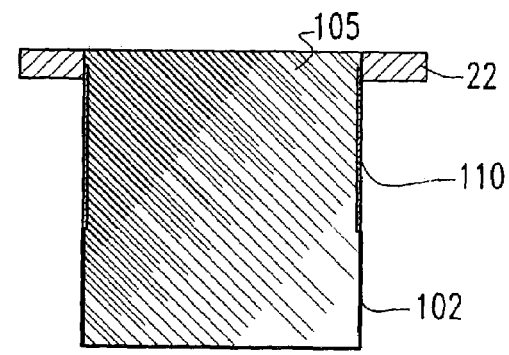

FIGS. 2A and 2B show the top view and a side view similar to FIG. 1C. In FIG. 2A, a trench has been defined and etched in mask 22, lined with oxide 110 and filled with poly 105. FIG. 2B shows the trench structure with lower electrode 102, upper collar electrode 110 and trench center electrode 105.

For convenience in claim terminology, the dimension common to FIGS. 1A, 1B and 1C will be referred to as the trench depth. The left-right dimension in FIG. 1C will be referred to as the trench length and the left-right dimension in FIGS. 1A and 1B will be referred to as the trench width. The trench width and trench length may also be referred to as transverse dimensions. A dimension in a first trench (e.g. length) compared with the same dimension in a second trench (e.g. also length) will be referred to as a corresponding dimension.

Figure 3:
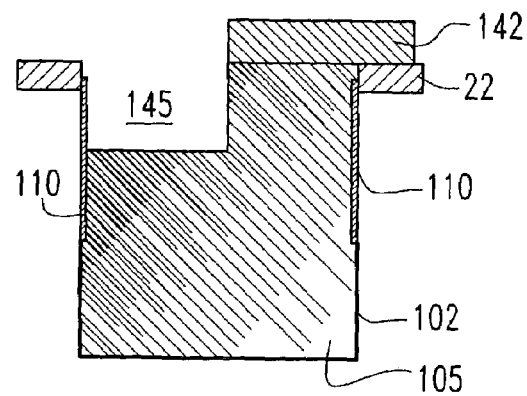
FIGS. 3 and 4 illustrate further steps in the formation of vertical transistors.

Referring now to FIG. 3, in order to form the transistor without disturbing the other elements, a block mask 142 is formed over the right side and an aperture 145 is etched that will hold the transistor. Transistor 150 will be formed using conventional processing, well known to those skilled in the art.

Figure 4:
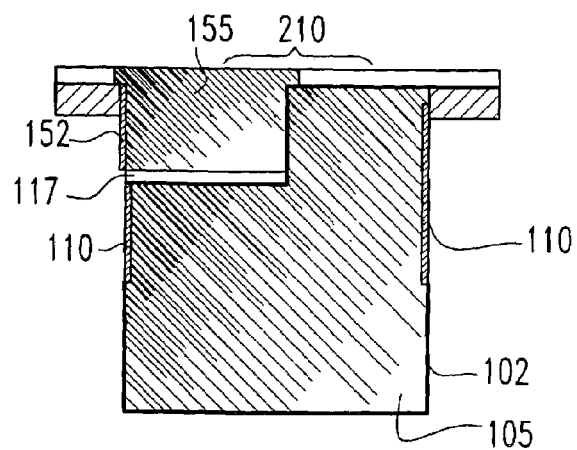

FIG. 4 shows the completed transistor, in simplified form, with tto 117 and, gate oxide 152 and gate electrode 155. A bracket 210 indicates the location of an isolation member that will separate the transistor from the contact extension.

The process described in FIGS. 2, 3, 4 can be generalized to either a PMOSFET or a NMOSFET device or different combinations of them.

Referring back to FIG. 1C, a pair of areas have been patterned (with the same active area mask used for planar transistors elsewhere in the circuit) that will contain contact areas and the remainder of the surface outside the masked area has been etched to form isolation trenches that have been filled with oxide 212. On the left, transistor 150 fills the vertical space as before. On the right, poly 105' is an extension of the poly 105 in the trench. This arrangement permits electrical contact to the lower electrode of transistor 150 through the path extending from poly extension 105' down and horizontally through the poly in the elongated trench.

This structure has the advantage over other methods of using a vertical transistor in that the only source of leakage in standby mode with voltage on the buried strap, is a single buried strap. Since the DRAM process is designed to have an extremely low leakage (on the order of femto-Amps) from the buried strap, this structure, implemented in DRAM technology, is attractive for low power devices. In contrast, planar MOSFETs are designed for fast switching speed and have junction leakage on the order of nano-Amps.

This structure provides a separate transistor that has the lower electrode accessible, as a planar transistor does. There will, of course, be an RC time constant associated with the lower node owing to the capacitance of the trench and the resistance of the path through poly 105. Preferably, this "trench node" will be used for contact to Vcc and/or Vdd and not as an internal node that needs to switch quickly. An inverter can be made by forming a vertical PMOSFET and NMOSFET Transistors connected conveniently. For example, two of the structures shown in FIG. 1C could be used to construct an inverter, with one trench node being connected to Vcc and connected through P+ poly to a PMOSFET transistor 150 and a corresponding structure with its (N+) trench node connected to ground and an NMOSFET transistor 150 connected to the interior node of the inverter.

Figure 7:
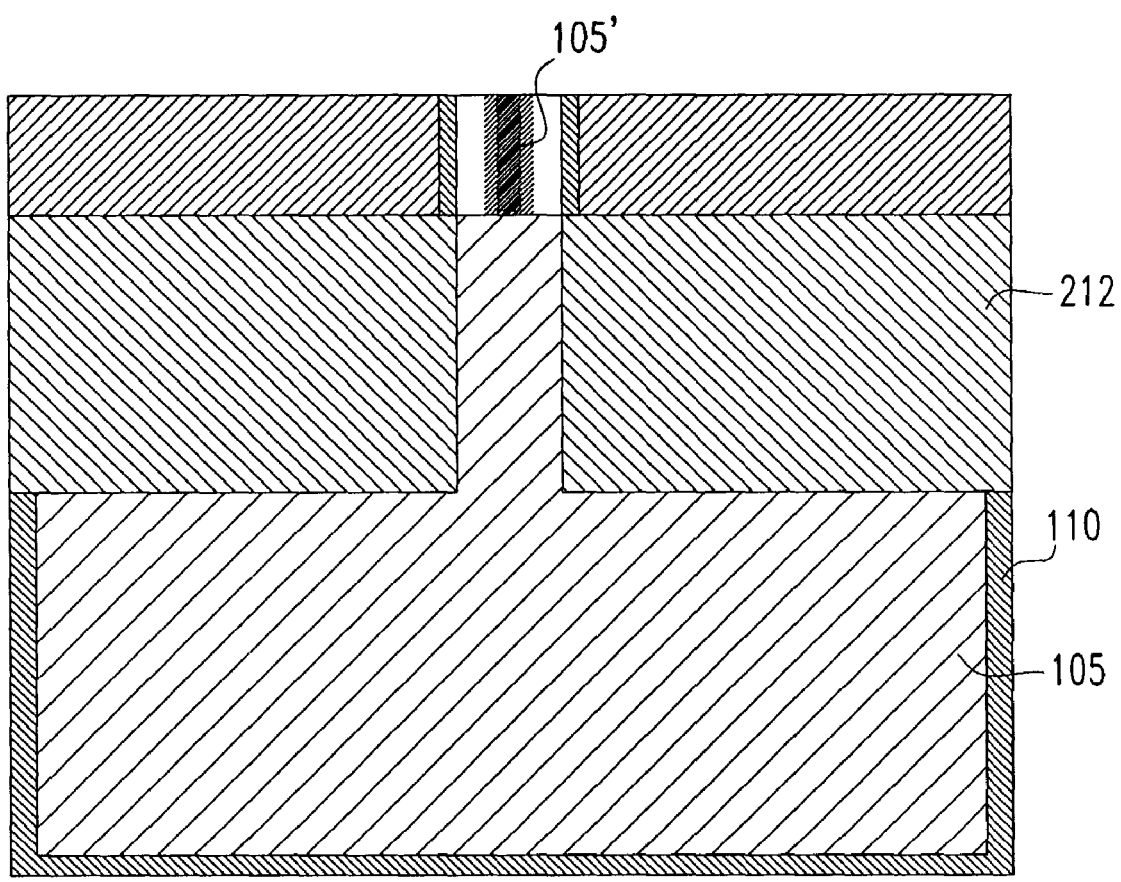
FIG. 7 illustrates a capacitor according to the invention.

The structure of FIG. 1C can be formed without any transistor by putting the block mask over the entire trench after electrode 105 has been planarized. In that case, the structure can function as a discrete resistor, having a resistance that can be varied at the mask stage by changing the length of the trench. Also, the same structure or a similar one shown in FIG. 7 can be used as a capacitor. Several capacitors according to the invention may be connected in parallel to provide a larger capacitance, e.g. in an ESD structure.

Figure 5A:
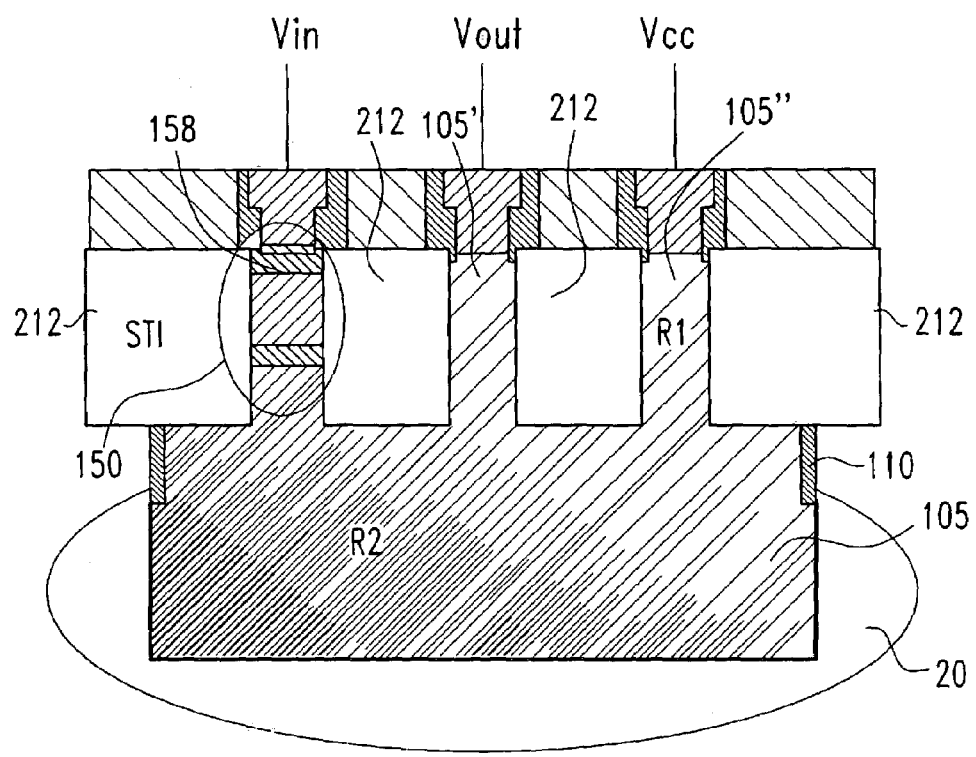
FIGS. 5A and 5B illustrate a structure for an amplifier and its schematic.
Figure 5B:
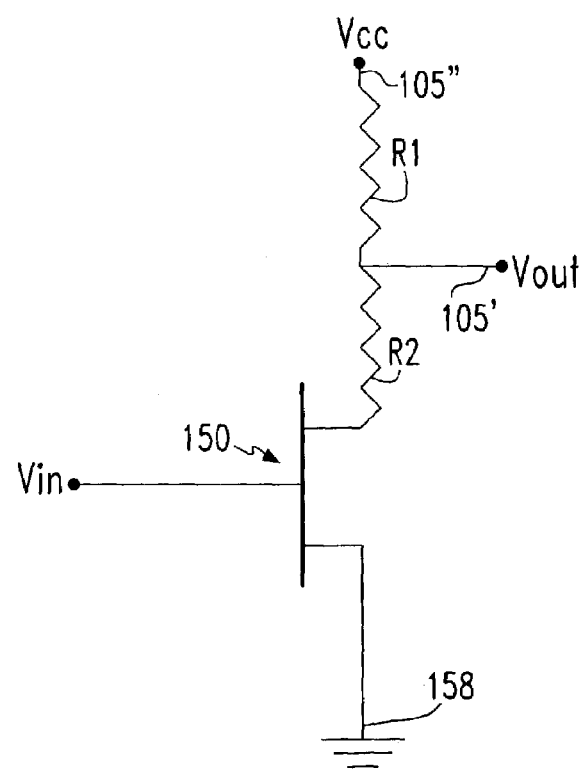

Referring now to FIGS. 5A and 5B, there is shown a structure that functions as a single-transistor amplifier and a schematic for the structure. The structure of FIG. 5A is formed by the same process steps as that in FIG. 1C, with the block mask covering space for two poly extensions 105' and 105'' that provide resistances R1 and R2 in the circuit. The spacing between R1 and R2 is set such that the desired ratio of resistances is provided. Those skilled in the art will be familiar with the operation of this circuit and realize that it can be used not only as an amplifier, but also as a component in more complex circuits, such a sense amplifiers, differential amplifiers and the like.

Figure 6A:
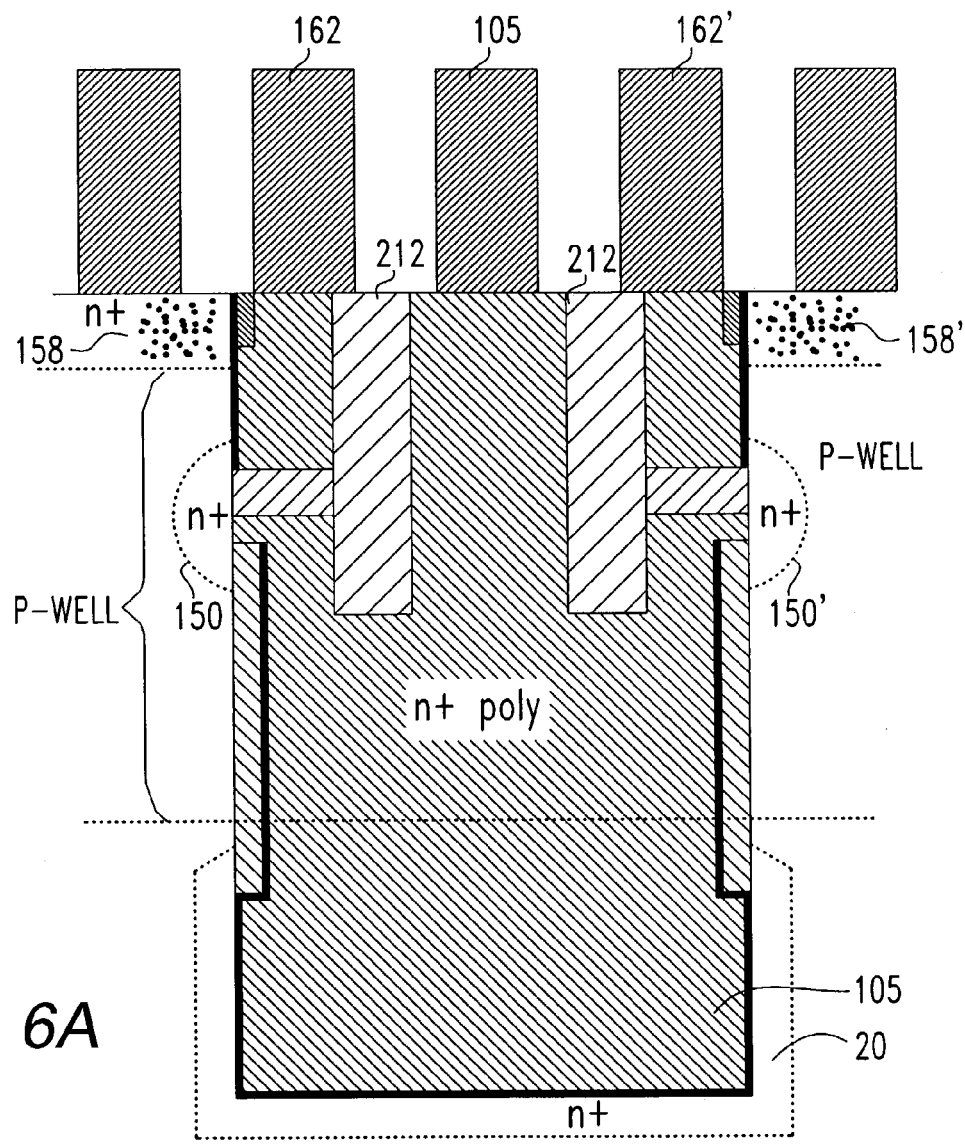
FIGS. 6A and 6B illustrate a two-transistor module and an application therefore.
Figure 6B:
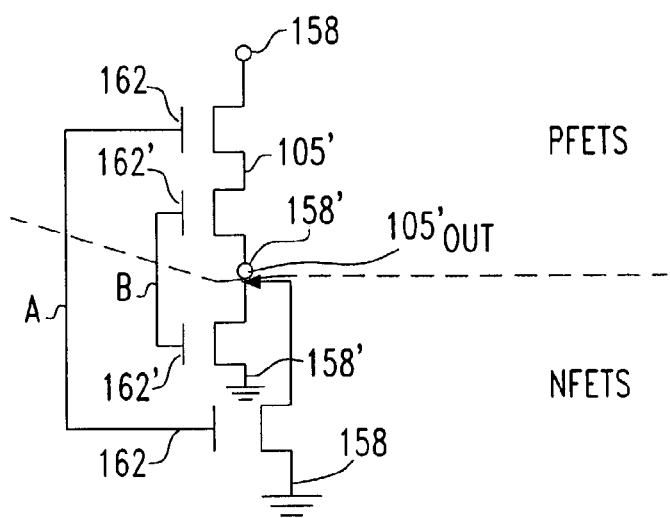

Another basic module is illustrated in FIG. 6A, with one application shown schematically in FIG. 6B. In this case, there are two transistors 150 and 150', located on either side of the trench, with poly extension 105, in the middle. The processing is the same as before, with a block mask being put over the center of the trench while the transistors are formed on the sides. This structure provides the option of connecting the transistors 150, 150' in series or in parallel.

FIG. 6B illustrates a two-input NOR circuit that shows both alternatives. In the upper portion, the trench electrode 105 is P+ and the transistors are PMOSFETs. As can be seen, contact 158 of the left-hand transistor is tied to Vcc, the interior node 105' is not used and the right transistor 150' has its drain connected to the output node. The gates of the transistors are connected to inputs A and B as shown.

In the lower portion of FIG. 6B, a similar structure with N+ poly and NMOSFETs has its transistors connected in parallel, with node 105' connected to the output node of the circuit and electrodes 158 and 158' both connected to ground (or vice versa). Gates 162, 162' are also connected to inputs A and B. Those skilled in the art will appreciate that this basic structure can also construct two-input NAND circuits by simple rearrangement. Also, more complex logic circuits can be constructed with these building blocks.

After the steps shown here, planar transistors will be formed and the transistors and other devices connected to form the circuit. Such steps, well known to those skilled in the art, will be referred to summarily in the claims as "completing the circuit".

The trenches are illustrated in the context of using the same trenches for DRAM cells and for generalized vertical transistors. It is not necessary that the second subset of trenches be as deep as the DRAM cells, though it is advantageous to use the same etching step. In circuits that do not have DRAM cells, the only requirement on trench depth is that the trenches be deep enough to fit the vertical transistor and the lower electrode. The transistor trenches according to the invention may be used to make general logic circuits, as well as SRAM arrays.

While the invention has been described in terms of a single preferred embodiment, those skilled in the art will recognize that the invention can be practiced in various versions within the spirit and scope of the following claims.

What is claimed is:

1. An integrated circuit containing a set of deep trenches in a semiconductor substrate, a first subset of which trenches have a first transverse dimension and a second subset of which trenches have an elongated transverse dimension greater than said first dimension and corresponding to said first dimension;
   a set of capacitors, having a center electrode, formed in said first and second subsets of deep trenches;
   a set of vertical transistors formed in said first subset and in at least some of said second subset and having a lower electrode connected to said center electrode; and
   an extension of said center electrode, extending above said lower transistor electrode of said vertical transistor and isolated from said vertical transistor to a surface contact at a vertical location at least at a substrate surface, in said at least some of said second subset, whereby a conductive path is established between said surface contact and a lower transistor electrode of said vertical transistors.

2. An integrated circuit according to claim 1, in which said first subset of trenches are arranged in an array of memory cells.

3. An integrated circuit according to claim 1, in which said second subset of trenches comprises at least some members with p-type center electrodes and having PMOSFETs formed therein and at least some members with n-type center electrodes and having NMOSFETs formed therein.

4. An integrated circuit according to claim 3, further comprising at least one inverter formed from a first member of said second subset with a p-type center electrode and having a PMOSFET formed therein and a second member of said second subset with an n-type center electrode and having an NMOSFET formed therein.

5. An integrated circuit according to claim 1, in which at least some of said second subset of trenches contain at least two vertical transistors, each of which has a lower electrode in electrical contact with said center electrode.

6. An integrated circuit according to claim 5, in which said second subset of trenches comprises at least some members with p-type center electrodes and having vertical PMOSFETs formed therein and at least some members with n-type center electrodes and having vertical NMOSFETs formed therein.

7. An integrated circuit according to claim 6, in which said second subset of trenches comprises at least some members with p-type center electrodes and having two vertical PMOSFETs formed therein and forming a two PMOSFET module and at least some members with n-type center electrodes and having two vertical NMOSFETs formed therein and forming a two NMOSFET module.

8. An integrated circuit according to claim 7, further comprising at least one two-input NOR gate formed by a two PMOSFET module and a two NMOSFET module.

9. An integrated circuit according to claim 7, further comprising at least one two-input NAND gate formed by a two PMOSFET module and a two NMOSFET module.

10. An integrated circuit containing a set of deep trenches in a semiconductor substrate, a first subset of which trenches have a first transverse dimension and a second subset of which trenches have an elongated transverse dimension greater than said first dimension and corresponding to said first dimension;
 a set of capacitors, having a center electrode, formed in said first and second subsets of deep trenches;
 a set of vertical transistors formed in said first subset and in at least some of said second subset and having a lower electrode connected to said center electrode; and
 an extension of said center electrode, extending above a lower transistor electrode of said vertical transistor and isolated from said vertical transistor to a surface contact at a vertical location at least at a substrate surface and connected to a circuit element other than said vertical transistor, in said at least some of said second subset, whereby a conductive path is established between said surface contact and a lower transistor electrode of said vertical transistors.

11. An integrated circuit according to claim 10, in which said second subset of trenches comprises at least some members with p-type center electrodes and having vertical PMOSFETs formed therein and at least some members with n-type center electrodes and having vertical NMOSFETs formed therein.

12. An integrated circuit according to claim 11, further comprising at least one inverter formed from a first member of said second subset with a p-type center electrode and having a vertical PMOSFET formed therein and a second member of said second subset with an n-type center electrode and having a vertical NMOSFET formed therein.

13. An integrated circuit according to claim 10, in which at least some of said second subset contain at least two vertical transistors, each of which has a lower electrode in electrical contact with said center electrode.

14. An integrated circuit according to claim 13, in which said second subset of trenches comprises at least some members with p-type center electrodes and having vertical PMOSFETs formed therein and at least some members with n-type center electrodes and having vertical NMOSFETs formed therein.

15. An integrated circuit according to claim 14, in which said second subset of trenches comprises at least some members with p-type center electrodes and having two vertical PMOSFETs formed therein and forming a two PMOSFET module and at least some members with n-type center electrodes and having two NMOSFETs formed therein and forming a two NMOSFET module.

16. An integrated circuit according to claim 15, further comprising at least one two-input NOR gate formed by a two PMOSFET module and a two NMOSFET module.

17. An integrated circuit according to claim 15, further comprising at least one two-input NAND gate formed by a two PMOSFET module and a two NMOSFET module.

* * * * *